United States Patent [19]

Tiemann

[11] 4,259,596

[45] Mar. 31, 1981

[54] CHARGE TRANSFER SIGNAL PROCESSING APPARATUS FILTER

[75] Inventor: Jerome J. Tiemann, Schenectady, N.Y.

[73] Assignee: General Electric Company, Schenectady, N.Y.

[21] Appl. No.: 105,757

[22] Filed: Dec. 20, 1979

[51] Int. Cl.$^3$ .................. G11C 19/28; H01L 29/78; H03H 15/02
[52] U.S. Cl. ............................. 307/221 D; 357/24; 333/165
[58] Field of Search .................. 357/24; 307/221 D; 333/165

[56] References Cited

U.S. PATENT DOCUMENTS

| | | | |
|---|---|---|---|
| 4,163,957 | 8/1979 | Knauer et al. | 307/221 D |
| 4,188,597 | 2/1980 | Knauer | 307/221 D |

OTHER PUBLICATIONS

Knauer et al., "Parallel-in/Serial-out: A New Approach for CCD Transversal Filters", Electronics Letters, vol. 13, (Mar. 3, 1977), pp. 126-127.

Primary Examiner—Gene M. Munson
Attorney, Agent, or Firm—Julius J. Zaskalicky; James C. Davis, Jr.; Marvin Snyder

[57] ABSTRACT

A filter utilizing charge transfer devices and having resonant transfer characteristics is described. The filter includes a first charge transfer shift register including a plurality of stages to which a first sequence of packets of charge is serially applied and clocked from stage to stage. Charge division and collection means are provided at the various stages of the shift register to divide and collect fractions of charge appearing in the various stages thereof. The charge collection means of the various stages except the last are connected together to provide a first output representing the sum of the charges collected at the various stages thereof. These fractions represent the weighting coefficients of the various stages of the first shift register. A second charge transfer shift register identical to the first shift register is provided. A second sequence of packets of charge is serially applied to the second shift register and clocked from stage to stage. The charge collection means of the various stages except the last are connected together to provide a second output representing the sum of the charges collected at the various stages thereof. The output of the last stage of the first shift register is coupled to the input of the second shift register and the output of the last stage of the second shift register is coupled to the input of the first shift register so as to implement a recursive feedback of charge. A resultant output is obtained which is the difference of the first and second outputs.

4 Claims, 7 Drawing Figures

CHARGE TRANSFER SIGNAL PROCESSING APPARATUS FILTER

The present invention related in general to charge transfer signal processing apparatus and more particularly to such apparatus for implementing a resonant transfer characteristic.

This patent application is related to patent applications Ser. No. 105,758 and Ser. No. 105,756, both filed concurrently herewith and assigned to the assignee of the present invention.

An object of the present invention is to provide sampled data filter apparatus which provides impulse responses of infinite duration.

Another object of the present invention is to provide sampled data filter apparatus which can implement a general class of infinite impulse response functions which are products of decaying exponentials multiplied by arbitrary functions of alternating polarity.

Another object of the present invention is to provide sampled data filter apparatus for implementing an impulse response that is an exact sampled data approximation of a decaying sinusoid.

Another object of the present invention is to provide sampled data filter apparatus in which both the input and output thereof are packets of charge whereby the cascading of such filters is simplified.

Another object of the present invention is to provide sampled data filter apparatus with essentially complete isolation between the output thereof and the clock voltages needed to store and transfer packets of charge therein.

Another object of the present invention is to provide a sampled data filter of improved linearity.

A further object of the present invention is to provide sampled data filter apparatus which is capable of operation at extremely high frequencies.

In carrying out the present invention in one illustrative embodiment thereof there is provided a substrate of semiconductor material having a major surface. A first plurality of first charge storage cells is provided in the substrate adjacent the major surface and arranged in a sequence. The width of each successive first charge storage cell is equal to or less than the width of a respective preceding first charge storage cell. Each of the first charge storage cells succeeding the first which has a width greater than the width of a succeeding first charge storage cell includes a first charge storage region and a second charge storage region. The ratio of the width of the first charge storage region to the sum of the widths of the first and second storage regions of each of the first charge storage cells is set equal to a respective one of a first sequential series of predetermined values. The values assigned to a first cell except for the last not divided into a first and second region is zero. The first plurality of first storage cells is serially coupled to form a first plurality of stages of a first charge transfer shift register, each stage including a respective first cell. A first plurality of first collection means is provided. Each first collection means is coupled to a respective first storage region for collecting charge stored therein. Each of the first collection means except the first collection means coupled the last of the first charge storage cells being connected in common. A first sequence of packets of charge representing positive weighted components of samples of a signal is provided. Means are provided for serially introducing to the initial cell of the first shift register each of the packets of charge of the first sequence and thereafter periodically and serially transferring each of the packets of charge from first cell to first cell including the transfer of portions of the packets of charge from each of the first storage regions to a respective first collection means.

A second plurality of first charge storage cells is provided in the substrate adjacent the major surface thereof and arranged in a sequence. The width of each successive first charge storage cell is equal to or less than the width of a respective preceding first charge storage cell. Each of the first charge storage cells succeeding the first charge storage cell which has a width greater than the width of a succeeding first charge storage cell including a first charge storage region and a second charge storage region. The ratio of the width of the first storage region to the sum of the width of the first and second storage regions of each of the first charge storage cells of the second plurality is set equal to a respective one of a second sequential series of predetermined values. The values assigned to a first cell except for the last not divided into a first and second region is zero. Corresponding values of the first and second sequential series of predetermined values are equal. The second plurality of first charge storage cells is serially coupled to form a second plurality of stages of a second charge transfer shift register, each stage of which includes a respective first cell. A second plurality of first collection means is provided, each first collection means being coupled to a respective first storage region for collecting charge stored therein. All of the first collection means of the second plurality except the first collection means coupled to the last of the first charge storage cells of the second plurality are connected in common. A second sequence of packets of charge representing negative weighted components of the aforementioned signal is provided. Means are provided for serially introducing to the initial cell of the second shift register each of the packets of charge of the second sequence and thereafter periodically and serially transferring each of the packets of charge from first cell to first cell including the transfer of portions of the packets of charge from each of the first storage regions to a respective first collection means. Means are provided for transferring the charge collected by the first collection means coupled to the last of the first cells of the first plurality to the initial one of the first cells of the second plurality. Means are also provided for transferring the charge collected by the first collection means coupled to the last of the first cells of the second plurality to the initial one of the first cells of the first plurality. Means are provided for deriving output signal samples, each of which represents the difference of the charge collected by the first collection means of the first plurality connected in common and collected by the first collection means of the second plurality connected in common.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
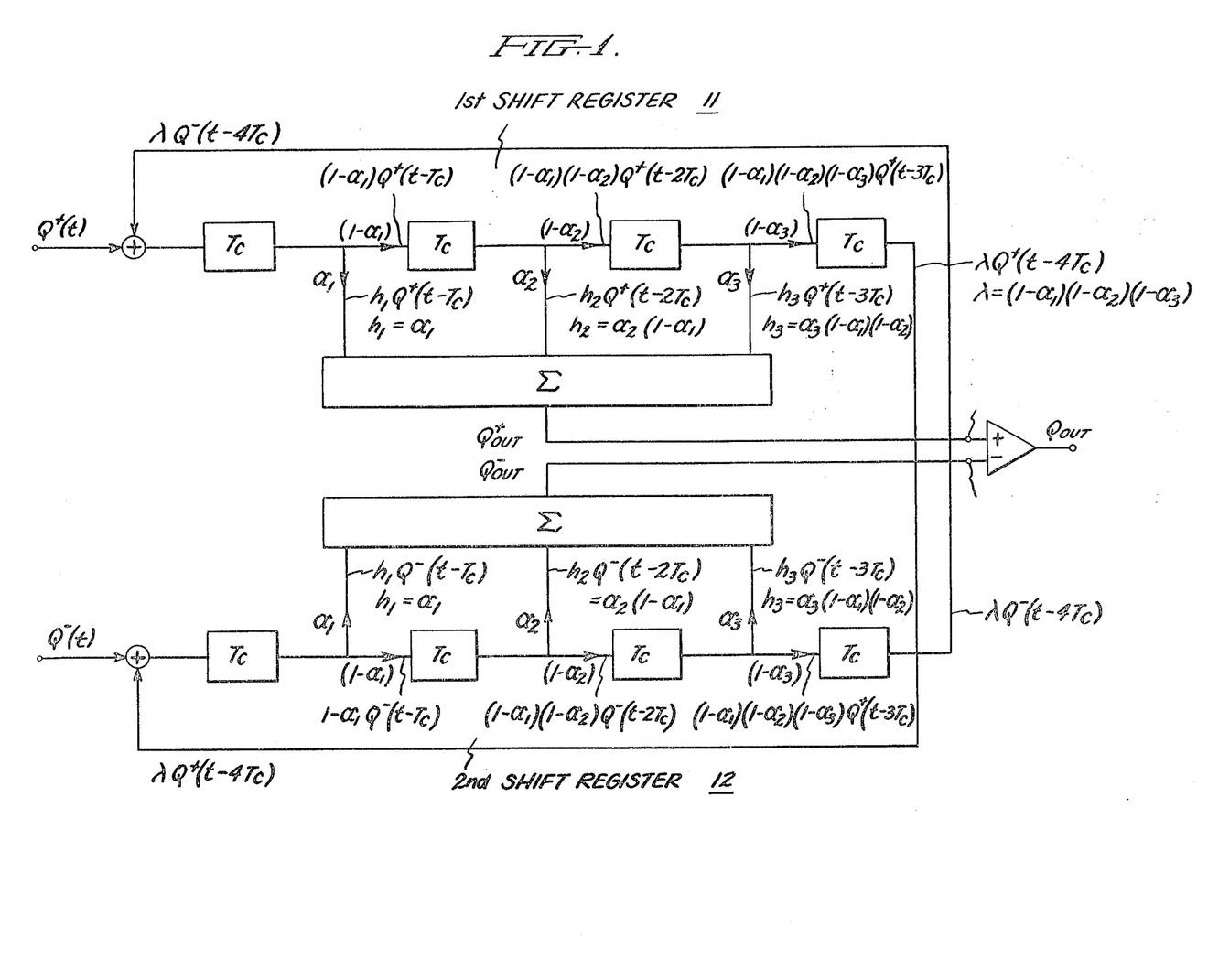
FIG. 1 is a block diagram of sampled data apparatus in accordance with the present invention.

Reference is now made to FIG. 1 which shows a functional block diagram of a sampled data recursive resonator 10 with a single resonance for implementing a pair of complex conjugate poles in the system function of a sampled data filter. The recursive resonator provides an impulse response of the form:

$$f(t) = \left[ \Sigma (-\lambda)^n \delta \left( t - \frac{nT}{2} \right) \right]^* \left[ G(t); 0 < t < \frac{T}{2} \right] \quad (1)$$

where $\Sigma(-\lambda)^n \delta(T-n(T/2))$ is a Comb function providing a sequence of samples of alternating polarity of decaying amplitude having a total period of T, each successive sample being a constant fraction of the previous sample, and G(t) is an arbitrary sequence of single polarity having a period of T/2, and the symbol * between these functions indicates a convolution. The filter comprises a first charge transfer shift register 11 having four stages to which a first sequence of charge packets $Q^+$ representing positive weight components of a sequence of signal samples is introduced and serially transferred or clocked from stage to stage at a frequence $f_c$ with each stage providing a delay of $T_c$, where $T_c$ is equal to $1/f_c$. The filter also comprises a second shift register 11' of four stages to which a second sequence of charge packets $Q^-$ representing negative weight components of the sequence of signal samples is serially introduced and serially transferred or clocked from stage to stage at the same frequency $f_c$. Thus, each input signal sample is represented by the difference in respective corresponding charge packets in the first and second sequences. In the first shift register the packet of charge in each of the stages is split into a first portion $\alpha$ which is collected in a respective charge collecting means and a second portion 1-$\alpha$ which is transferred to the next stage of the shift register. Thus, for each packet of charge introduced into the first shift register successive fractions of the packet of charge are collected in successive collecting means. For each of the four stages these successive fractions are designated $h_1$, $h_2$, $h_3$, and $\lambda$, respectively. In terms of the division factors $\alpha_1$, $\alpha_2$, $\alpha_3$, and $\alpha_4$ of the four stages of the shift register the fraction $h_1$, $h_2$, $h_3$, and $\lambda$ are as set forth in the following equations:

$$h_1 = \alpha_1 \quad (2)$$

$$h_2 = \alpha_2(1-\alpha_1) \quad (3)$$

$$h_3 = \alpha_3(1-\alpha_1)(1-\alpha_2) \quad (4)$$

$$\lambda = (1-\alpha_1)(1-\alpha_2)(1-\alpha_3) \quad (5)$$

Similarly, in the second shift register the packet of charge in each of the stages is split into a first portion which is collected in a respective charge collecting means and a second portion $1-\alpha$, which is transferred to the next stage of the second shift register. Thus, for each packet of charge introduced into the second shift register successive fractions of the packet of charge are collected in successive collecting means. Each of the fraction for four stages of the second shift register is identical to the fractions of the corresponding stage of the first shift register and each is so designated. The fraction of the packet collected in the collecting means of the fourth or last stage of the first shift register is applied to the input of the first stage of the second shift register and is added to the packet applied thereto. The fraction of the charge packet collected by the collecting means of the fourth or last stage of the second shift register is applied to the input of the first stage of the first shift register and is added to the packet applied thereto. The collecting means of all of the stages except the last stage of the first shift register are connected in common and provide a summation signal $Q^+_{out}$ in the form of a sequence of the positive weight components of the output signal. The collecting means of all of the stages except the last of the second shift register are connected in common and provide a summation signal $Q^-_{out}$ in the form of a sequence of the negative weight components of the output signal. The sequence of samples of the output signal is obtained by differentially summing corresponding charge packets in the two output sequences $Q^+_{out}$ and $Q^-_{out}$. This may be done in a differential amplifier, the $Q^+_{out}$ sequence being applied to the non-inverting terminal of the amplifier and the $Q^-_{out}$ sequence being applied to the inverting terminal of the amplifier to produce at the output a sequence of signal samples represented by $Q_{out}$.

Figure 2:
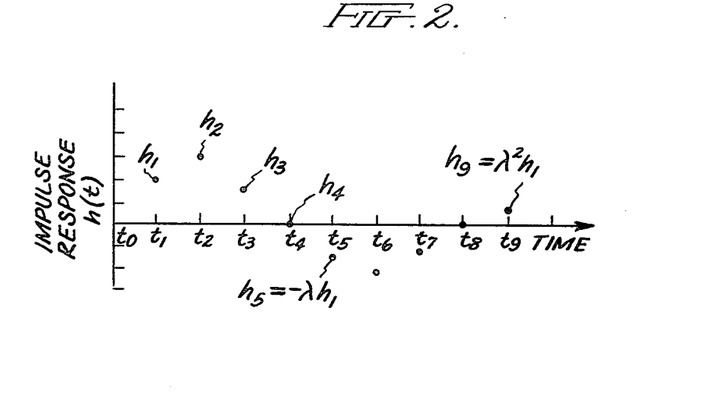
FIG. 2 shows a diagram of the impulse response of the sampled data apparatus of FIG. 1.

The response of the recursive resonator of FIG. 1 will now be described in connection with FIG. 2 for the case where a unit impulse of charge is applied at time $t_0$ to the first shift register 11, and no input or charge is applied to the second shift register 11'. It is assumed that the tap weights $h_1$, $h_2$ and $h_3$ are set in proportion to the respective ordinates of a half sine wave at 45°, 90° and 135°, modified by multiplication by an exponential function. The quantity of charge collected at the common collection means of the first shift register at time $t_1$ after the first clock period $T_c$ is proportional to $h_1$. As the common collection means is connected to the non-inverting terminal of the differential amplifier, a positive output proportional to $h_1$ is also obtained at the output of the differential amplifier, as shown in FIG. 2. The quantity of charge collected at the common collection means at the end of the second clocking period at time $t_2$ is proportional to $h_2$, and the output of the differential amplifier is also proportional to $h_2$. The quantity of charge collected at the common collection means at the end of the third clocking period at time $t_3$ is proportional to $h_3$ and the output of the differential amplifier is also proportional to $h_3$. The fraction of the unit impulse of charge remaining at the end of the third period is proportional to $\lambda$. This fraction of charge is not collected by the common collection means but is applied after the end of the fourth clocking period at time $t_4$ to the input of the first stage of the second shift register 11'. Thus, at time $t_4$ the output of the differential amplifier is zero. Accordingly, it is seen that the amplitude of the signals appearing at the output of the differential amplifier for the time period $t_0 - t_4$ conform to a half sine wave decaying at a specific exponential rate. At the end of the next four clocking periods the charge collected in the common collecting means of the second shift register is equal to the charges collected at the end of the first four clocking periods multiplied by the fraction λ. As these charges are applied to the negative or inverting terminal of the differential amplifier the output obtained, as shown in FIG. 2, is a negative half decaying sine wave the amplitudes of which are equal to λ times the amplitudes of the positive half sine wave obtained over the period $t_0-t_4$. At the end of the eighth clocking period the output obtained from the fourth stage of the second shift register is applied to the first stage of the first shift register. Accordingly, over the next succeeding four clocking periods outputs are obtained which are equal to the outputs obtained over first four clocking periods multiplied by factor $λ^2$. Thus, it is readily apparent that the output or impulse response is that of an exponentially decaying sinusoid which may be represented by the equation:

$$Q_{out} = e^{at} \sin bt. \qquad (6)$$

where $$a = \frac{2f_c}{N} \ln λ$$

and $b = 2π/8T_c$.

The attenuation constant a is derived in the following manner. As described above for a full period T the decay in output is equal to $λ^2$. Thus, $$e^{-aT} = λ^2. \qquad (7)$$

Noting that $T = NT_c$, and that $T_c = 1/f_c$, equation 7 is solved for a yielding $$a = \frac{2f_c}{N} \ln λ$$

Figure 3:
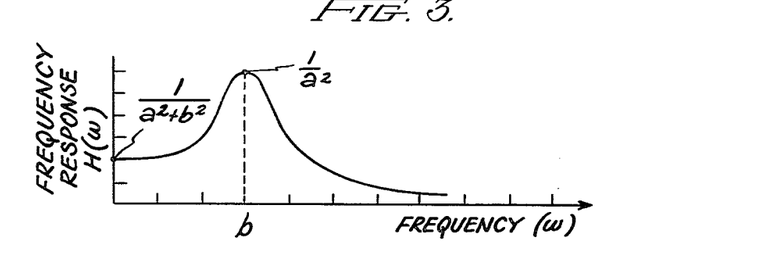
FIG. 3 shows a diagram of the frequency response of the sampled data apparatus of FIG. 1.

If additional impulses of charge were applied to the first shift register, each of the outputs would be the same as shown in FIG. 2 except shifted in time. Also, if the impulse of charge were applied to the second shift register, while applying no signal to the first shift register, the output obtained would be the same as shown in FIG. 2 except inverted in polarity. Thus, as any input signal applied to the first shift register can be decomposed into a sequence of impulses and also as any input applied to the second shift register can also be decomposed into a sequence of impulses, it is apparent that the response of the filter of FIG. 1 to such inputs would be simply the superposition of the response of the filter to the individual impulse into which the input signals are decomposed. Thus, by convolving the positive weighted components and the negative components of an input signal with the impulse response as shown in FIG. 2, the output from such a filter would be obtained. FIG. 3 shows the transfer of the impulse response of FIG. 2 into the frequency domain.

Figure 4:
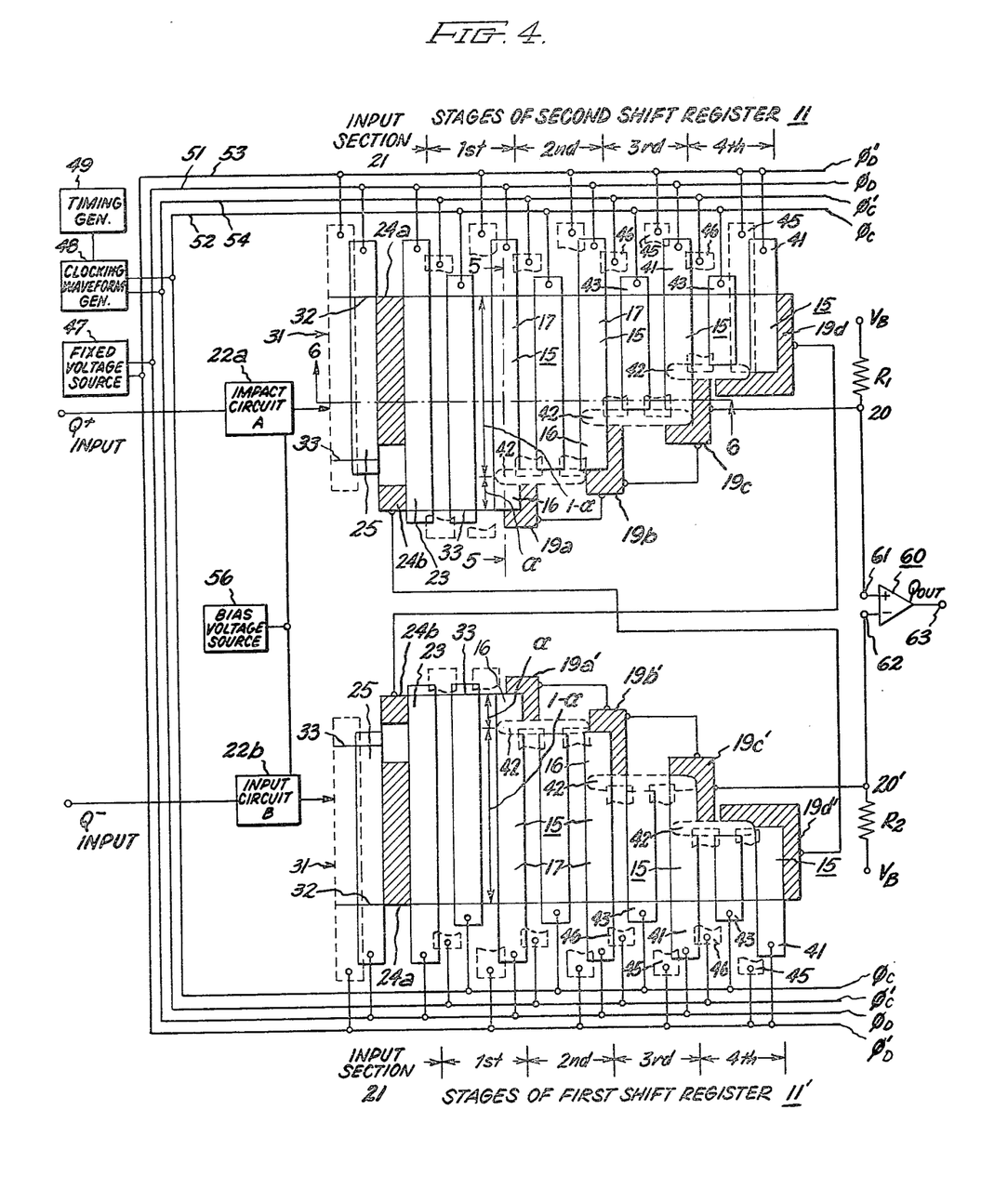
FIG. 4 is a plan view of one embodiment of sampled data apparatus in accordance with the present invention.
Figure 5:
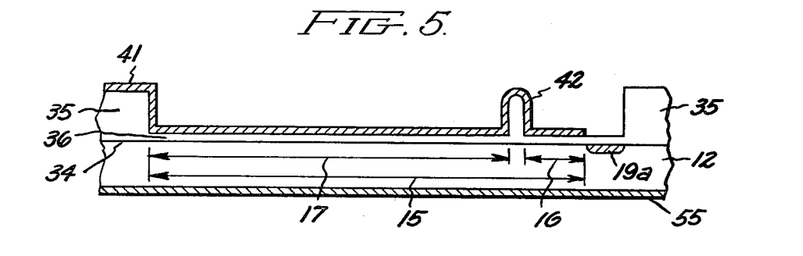
FIG. 5 is a sectional view of the embodiment of FIG. 4 taken along section lines 5—5 thereof.
Figure 6:
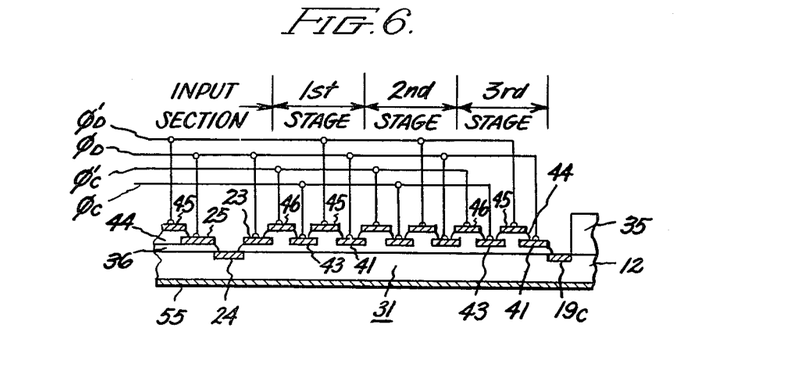
FIG. 6 is a sectional view of the embodiment of FIG. 4 taken along sectional lines 6—6 thereof.
Figure 7:
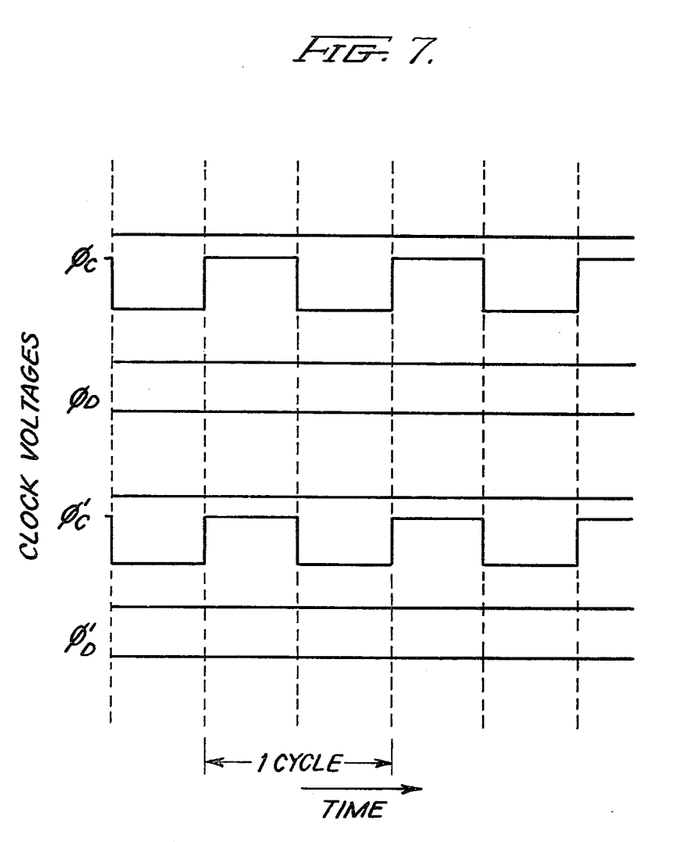
FIG. 7 is a diagram of voltage waveforms useful in describing the operation of the apparatus of FIGS. 4-6.

Reference is now made to FIGS. 4–6 which show apparatus 10 for implementing the sampled data recursive resonator of FIG. 1 in accordance with the present invention. The apparatus 10 comprises a first charge transfer shift register 11 including a plurality of charge storage and transfer stages formed on a common substrate 12. Each of the stages includes a first charge storage cell 15. The first charge storage cells 15 of successive stages form a sequence of first charge storage cells. The first charge storage cell 15 of the first stage has a width of unity. Each succeeding first charge storage cell has a width equal to or less than the respective preceding first charge storage cell 15. Each first charge storage cell 15 which has a width greater than the width of a succeeding first charge storage cell has two parts, a first part 16 designated as a first charge storage region having a width of α and a second part designated as a second charge storage region 17 having a width of $1-α$. A second shift register 11' is provided identical to the first shift register 11 and identical designations are utilized for the various elements thereof. The weighting coefficients of the various stages of the first shift register are selected to provide a desired sequence of single polarity G(t) in equation 1 above.

Reference is now made to the first shift register 11. The first charge storage cell of the first stage has a first storage region of width $α_1$ and a second storage region of width $1-α_1$. The first charge storage cell of the second stage has a first storage region of width $α_2$ and a second storage region of width $1-α_2$. The first charge storage cell of the third stage has a first storage region of width $α_3$ and a second storage region of width $1-α_3$. The first charge storage cell of the fourth or last stage is undivided. Adjacent the first storage region 16 of the first stage a first charge recovery or collection means in the form of a region of opposite conductivity 19a is provided for collection of charge flowing into the first storage region 16 of this stage. Adjacent the first storage region 16 of the second stage a second collection means 19b is provided. Adjacent the first storage region 16 of the third stage a third charge collection means 19c is provided. Adjacent the first charge storage cell 15 of the fourth or last stage a fourth charge collection means 19d is provided. The charge collection means 19a, 19b, and 19c are connected together and to output terminal 20 to provide the aggregate or sum of the charge collected at each of the first three stages of the shift register. The potentials on the collection means 19a, 19b and 19c are maintained at values less than the potentials of the storage regions 16 of respective first, second and third stages of the shift register to assure collection of charge from them by connection of the collection means to a bias voltage $V_B$ through a load resistance R. An input section 21 is provided for receiving and storing packets of charges supplied thereto by an input circuit 22a. The input section 1 comprises a first charge storage cell 23 of the same width as the first charge storage cell 15 of the first stage and coupled thereto along its width, a first region 24a of opposite conductivity type shorter than the first charge storage cell 15 of the first stage and contiguous to the first charge storage cell 23 along its width, and another first charge storage cell 25 also of the same width as the first charge storage cell 15 of the first stage and contiguous to the region 23 of opposite conductivity type along its width. A second region 24b of opposite conductivity type spaced from region 24a and contiguous to first charge storage cell 23 along its width is provided for coupling charge into the first charge storage cell of the input section from the second shift register as will be described in more detail below.

The shift register 11 is formed on a semiconductor substrate 12 of N-type conductivity which has a channel portion 31, the upper side 32 of which is a straight and the lower side 33 of which has several steps. Typically the substrate 12 may be silicon semiconductor of suitable resistivity, for example, 4 ohm-cm. Overlying the major surface 34 of the substrate 12 is a thick insulating member 35 of silicon dioxide having a thin portion 36 lying in registry with the channel portion 31.

A plurality of first parallel lines 41 are provided each extending generally parallel and overlying a respective one of the first charge storage cells 15. The portions of lines 41 overlying the first storage cell 15 of the first stage and also 23 are of the same width (and designated unity width). The portion of the line 41 overlying first storage cell 15 of the second stage is equal to $1-\alpha_1$. The portion of the line 41 also overlying first storage cell 15 of the third stage is equal to $(1-\alpha_1)(1-\alpha_2)$. The portion of the line 41 overlying the first cell of the fourth stage is equal $(1-\alpha_1)(1-\alpha_2)(1-\alpha_3)$. The first storage region 16 and the second storage region 17 of each of the first cells of the first, second and third stages is provided by respective blocks 42 of thick insulation over which the lines 41 pass. A plurality of second parallel lines 43 are provided, each parallel to the lines 41 and interleaved therebetween. The portions of the substrate in the channel portion 31 underlying these conductors are designated the second charge storage cells. Each of the lines 41 is of uniform length in the direction of charge transfer in the channel. Similarly, each of the second lines 43 is of uniform length in the direction of charge transfer in the channel. The lines 41 and the lines 43 are spaced apart by a distance less than the length of a line 41. A thin layer of insulation 44 is provided overlying the first and second parallel lines. A plurality of third parallel lines 45 are provided overlying the insulating layer 44. Each of the third lines 45 is insulatingly spaced between a respective first line 41 and a respective preceding second line 43. A plurality of fourth parallel lines 46 are also provided overlying the insulating layer 44. Each of the fourth lines 46 is insulatingly spaced between a respective second line 43 and a respective preceding first line 41. The fourth lines 46 overlie both the second and first lines. The third and fourth lines 45 and 46 are shown in dotted outline to illustrate with clarity the structure and organization of the apparatus. The sets of four lines form a plurality of groups of electrodes, each group of electrodes being serially arranged on a respective part of the thin portion of the insulating member and overlying a respective part of the channel of the shift register thereof to form with the substrate a plurality of stages of a charge transfer shift register.

The first lines 41 overlying the first and second storage regions 16 and 17 of the first storage cells 15 are designated as $\phi_D$ electrodes and are connected to a common line 51 which in turn is connected to a source 47 of $\phi_D$ voltage. All of the second lines 43 overlying the second storage regions are designated as $\phi_C$ electrodes and are connected to a common line 52 which in turn is connected to a source 48 of $\phi_C$ clocking voltage. All of the transfer electrodes 45 which overlie the leading or input edge of the first storage cells 41 are designated as $\phi_D'$ electrodes and are connected to a common line 53 which in turn is connected to source 47 of voltage. All of the transfer electrodes 46 which overlie a leading or input edge of a $\phi_C$ electrode 43 are designated as $\phi_C'$ electrodes and are connected in common to a common line 54 which in turn is connected to source 48 of $\phi_C'$ voltage. A conductive layer 55 of a suitable material such as gold is eutectically bonded to the lower surface of the substrate 12 to provide a substrate contact to which the ground line of the $\phi_D$, $\phi_D'$, $\phi_C$ and $\phi_C'$ sources are connected.

The manner in which the packets of charge are clocked into the shift register 11, transferred from stage to stage along the shift register and processed therein will now be described in connection with the diagrams of FIG. 5, which shows the clocking voltage waveform $\phi_D$, $\phi_C$, $\phi_D'$ and $\phi_C'$. Each stage of the shift register 11 includes a $\phi_D$ storage cell underlying a $\phi_D$ line 41 and a $\phi_C$ storage cell underlying a $\phi_C$ line 43. The $\phi_D$ voltage applied to the $\phi_D$ line 41 is fixed. The $\phi_C$ voltage applied to the $\phi_C$ line cycles between a high level and a low level above and below the $\phi_D$ voltage. When the $\phi_C$ voltage is at its high level charge transfer is enabled from the $\phi_C$ cell to the $\phi_D$ cell, and conversely when the $\phi_C$ voltage is at its low level charge transfer from the $\phi_D$ cell to the $\phi_C$ storage cell is enabled. Each stage also includes a $\phi_D'$ line 45 to which is applied a $\phi_D$ voltage of fixed value which produces a surface potential in the substrate underlying the electrode which is smaller in absolute magnitude than the surface potential underlying a $\phi_D$ line. Each stage also includes a $\phi_C'$ electrode 46 to which is applied a $\phi_C'$ voltage having two levels. At the upper level a surface potential is produced in the substrate underlying the electrode which inhibits the transfer of charge from a $\phi_D$ storage cell to a $\phi_C$ storage cell. At the lower level a surface potential is produced enabling the transfer of charge from a $\phi_D$ storage cell to a $\phi_C$ storage cell. Thus, when the $\phi_C$ voltage is at its high level, charge is transferred from a $\phi_C$ storage cell to a $\phi_D$ storage cell and when both the $\phi_C$ voltage and the $\phi_C'$ voltage are at their low levels charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to the next succeeding $\phi_C$ storage cell.

The second shift register 11' is identical to the first shift register 11 and corresponding elements thereof are identically designated except for the first, second, third and fourth collection means which are designated 19a', 19b', 19c', and 19d', respectively. The fourth collection means 19d of the first shift register 11 is conductively connected to region 24b of the input section of the second shift register 11'. Also fourth collection means 19d' of the second shift register 11' is conductively connected to region 24b of the input section of the first shift register 11.

Input circuits 22a and 22b are provided, each for generating a respective sequence of packets of charge corresponding to a respective sequence of signal samples. A first sequence of signal samples corresponding to the positive components of an input signal sequence is applied to input circuit 22a and a second sequence of samples corresponding to the negative components of the input signal sequence is applied to the input circuit 22b. Input circuits 22a and 22b, such as referred to above, are well-known in the art, one of which is described in connection with FIGS. 8A, 8B and 8C in the U.S. Pat. No. 7,032,867, assigned to the assignee of the present invention and incorporated herein by reference thereto. This particular circuit is referred to as a "fill and spill" circuit. Of course, other input circuits may be utilized. A bias voltage source 51 connected to the input circuits 22a and 22b provides a fixed bias charge component to each packet of charge developed by the input circuits 22a and 22b which facilitates the transfer thereof. The output of the input circuit 22a is applied to the input section 21 of the first shift register 11. The output of the input circuit 22b is applied to the input section 21 of the second shift register 11'.

An output circuit is provided for sensing the charge collected by the common collecting means 19a, 19b and 19c of the first shift register 11 and for sensing the charge collected by the common collecting means 19a', 19b', and 19c' of the second shift register 11' and providing an output which represents the difference of the sensed charges. To this end a bias voltage $V_B$ is applied to the common collecting means 19a, 19b, and 19c of the first shift register through a first resistance $R_1$ and also to the common collecting means 19a', 19b', and 19c' of the second shift register through a second resistance $R_2$ which is equal to the first resistance $R_1$. The potential $V_B$ is set to provide a potential at the collecting means of each of the shift registers which is less than the surface potential of the empty first storage cells 15 of the first and second shift registers. The signal appearing at the common collecting means 19a, 19b, and 19c of the first shift register is applied to the non-inverting terminal 61 of a differential amplifier 60. The signal appearing at the common collecting means of the second shift register 11' is applied to the inverting terminal 62 of the differential amplifier 60. Thus, at the output terminal 63 of the differential amplifier a signal is obtained which is the difference of the charges appearing at the common collecting means of the first and second shift registers.

In the operation of the apparatus of FIGS. 4-6, a sequence of packets of charge, each corresponding to a respective positive component of a signal is obtained from input circuit 22a, is supplied to the input section 21 of the first shift register 11, and is serially clocked from stage to stage thereof. At the first, second and third stages, packets of charge corresponding to weighting coefficients $h_1$, $h_2$ and $h_3$ are collected and appear at common collection means 19a-19c. The remaining component $\lambda$ of charge collected at the collection means 19d at the end of the fourth clocking cycle is supplied to the input section 21 of the second shift register 11' where it is accumulated or added to the charge residing therein at the end of the fourth clocking cycle. Also, a second sequence of packets of charge, each corresponding to a respective negative component of the signal, is obtained from input circuit 22b, is supplied to the input section 21 of the second shift register 11' and is clocked from stage to stage thereof. At the first, second and third stages, packets of charge corresponding to weighting coefficients $h_1$, $h_2$ and $h_3$ are collected at the common collection means 19a', 19b' and 19c'. The remaining component $\lambda$ of charge collected at the collection means 19d' at the end of the fourth clocking cycle is supplied to input section 21 of the first shift register 11 where it is accumulated or added to the charge residing therin at the end of the fourth clocking cycle. An output is obtained at the common collection means of each of the shift registers 11 and 11' which is the sum of the outputs to the first, second and third collection means thereof at the end of each of the clock cycles. As described in connection with FIG. 1, the output appearing at the common collection means 19a, 19b and 19c of the first shift register is a sequence of packets of charge, each packet representing the positive component of a series or sequence of values of an output signal. This sequence of packets develops a voltage across resistance $R_1$ which is applied to the non-inverting terminal 61 differential amplifier 60. Also, the output appearing at the common collection means 19a', 19b', and 19c' of the second shift register represents a second sequence of packets of charge, each representing the negative component of the sequence of values of an output signal. This sequence of packets develops a voltage across resistance $R_2$ which is applied to the inverting terminal 62 of differential amplifier 60. The difference of corresponding elements or values of the first and negative sequences is obtained at the output terminal 63 of the differential amplifier 60. As described in connection with FIG. 1 the sequence of output values represents the convolution of a Comb function with an arbitrary sequence of a single polarity.

While input circuits 22a and 22b are provided to convert an input signal into a positive weighted sequence and a negative weighted sequence for application to the first and second shift registers 11 and 11', if the positive weighted and negative weighted input sequences are in the form sequences of charge packets they may be directly applied to the input sections of the first and second shift registers without the necessity of converting a signal into positive weighted and negative weighted charge sequences.

To cascade the filter of FIG. 4 with another similarly constituted filter the positive weighted output or collection means of the first shift register 11 would be connected directly to the input section of the positive weighted shift register of the succeeding filter, for example, to a similarly constituted region of opposite conductivity type contiguous to the first cell of the succeeding filter, and also the negative weighted output or collection means of the second shift register 11' would be connected directly to input section of the negative weighted shift register of the succeeding filter.

While lengths of first storage cell 23, region 24a, and first storage cell 25 in the direction of charge transfer are shown as of the same length as the length of the first storage cells 15 for reasons of simplicity in illustrating and describing the apparatus, they are not required to be of such length. Both first cells 23 and 25 can be shorter in length than the length of a first charge storage cell 15. In general, first storage cell 25 would be shorter. The length of region 24 should be minimal consistent with good conductivity.

The charge division ratios ($\alpha$'s) for each stage and hence the weighting coefficient (h's) for each of the stages are selected to provide the desired impulse response in accordance with equation 1. Of course, while only four stages were shown in the filters of FIG. 4, any number may be utilized. In general the charge collection for output purposes may be divided into a number of output charge sums each derived from groups of charge collection means located at their respective stages. Also, while I have shown in FIG. 4 a charge division into two parts, in general the charge may be divided into three or more parts with each of the output charge parts summed into its respective output. The detailed choice of output values is dependent on the filter functions desired, and in all cases, the feedback fraction must take into account the total charge removed by all of such output streams.

While the filter of FIG. 4 utilizes charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices, are described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charge input circuits, such as those described above, could be used.

The filter apparatus of the present invention may also be implemented in bucket brigade technology; however, such implementation would be less advantageous than in the charge coupled technology shown and described in FIGS. 4-6, as bucket brigade devices are subject to charge transfer inaccuracies which limit their performance.

While charge division has been described where a single packet of charge is divided into two or more packets during the charge transfer operation, other means of dividing charge may be utilized in the apparatus of the present invention. Such charge division means are described in U.S. Pat. Nos. 4,124,861 and 4,124,862, both assigned to the assignee of the present invention and incorporated herein by reference.

While the invention has been described in specific embodiments in which single phase clocking systems have been employed, it will be understood that other clocking systems such as multi-phase clocking systems may as well be employed.

While the invention has been described in connection with apparatus consitututed of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What I claim as new and desire to Secure by Letters Patent of the United States is:

1. In combination,
a substrate of semiconductor material having a major surface,
a first plurality of first charge storage cells in said substrate adjacent said major surface arranged in a sequence, the width of each successive first charge storage cell being equal to or less than the width of a respective preceding first charge storage cell,
each of said first charge storage cells succeeding the first except the last which has a width greater than the width of a succeeding first cell including a first charge storage region and a second charge storage region,
the ratio of the width of the first storage region to the sum of the widths of the first and second storage regions of each of said first charge storage cells being set equal to a respective one of a first sequential series of predetermined values, the values assigned to a first cell except for the last not divided into a first and second region being zero,
said first plurality of first charge storage cells being serially coupled to form a first plurality of stages of a first charge transfer shift register, each stage including a respective first cell,
a first plurality of first collection means, each first collection means coupled to a respective first storage region for collecting charge stored therein, the first collection means of said first plurality except the first collection means coupled to the last of said first cells being connected in common,
means for providing a first sequence of packets of charge,
means for introducing serially to the initial first cell of said first shift register each of said first packets of charge and thereafter periodically and serially transferring each of said packets of charge from first cell to first cell including the transfer of portions of said packets of charge from each of said first storage regions to a respective collection means,
a second plurality of first charge storage cells in said substrate adjacent said major surface arranged in a sequence, the width of each successive first charge storage cell being equal to or less than the width of a respective preceding first charge storage cell,
each of said first charge storage cells of said second plurality succeeding the first charge storage cell which has a width greater than the width of a succeeding first cell including a first charge storage region and a second charge storage region,
the ratio of the width of the first storage region to the sum of the widths of the first and second storage regions of each of said first charge storage cells of said second plurality being set equal to a respective one of a second sequential series of predetermined values, the values assigned to a cell except for the last not divided into a first and second region being zero, corresponding values of said first and second sequential series being equal,
said second plurality of first charge storage cells being serially coupled to form a second plurality of stages of a second charge transfer shift register, each stage including a respective first cell,
a second plurality of first collection means, each first collection means coupled to a respective first storage region for collecting charge stored therein, the first collection means of said second plurality except the first collection means coupled to the last of the first cells of said second plurality being connected in common,
means for providing a second sequence of packets of charge,
means for serially introducing to the initial cell of said second shift register each of said packets of charge of said second sequence and thereafter periodically and serially transferring each of said packets of charge from first cell to first cell including the transfer of portions of said packets of charge from each of said first storage regions to a respective first collection means,
means for transferring the charge collected by the first collection means coupled to the last of said first cells of said first plurality to the initial one of said first cells of said second plurality,
means for transferring the charge collected by the first collection means coupled to the last of said first cells of said second plurality to the initial one of said first cells of said first plurality,
means for deriving signal samples each of which represents the difference of the charge collected by said first collection means of said first plurality connected in common and collected by said first collection means of said second plurality connected in common.

2. Charge transfer apparatus comprising a first plurality of first charge storage cells arranged in sequence, means dividing each of said first charge storage cells except the last into parts in a manner so that the ratio of charge contained within a first part of each of said first charge storage cells to the sum of the charges contained within all of the parts thereof is equal to a respective one of a first sequential series of predetermined values, said first sequential series of predetermined values corresponding to a sequential series weighting coefficients, each for a respective first charge storage cell, the last of said first charge storage cells of said first plurality being constituted so that the ratio of the charge contained therein to the charge contained within the first of said charge storage cells of said first plurality is equal to a first predetermined fraction, said first plurality of first charge storage cells being serially coupled to form a first plurality of stages of a first charge transfer shift register, each stage including a respective first charge storage cell, a first plurality of collection means, each collection means coupled to a first part of a respective first charge storage cell for collecting charge stored therein, the first collection means of said first plurality except the first collection means coupled to the last of said first cells being connected in common, means for providing a first input sequence of packets of charge, each packet representing a respective sample of a first signal, means for introducing sequentially into the initial cell of said first shift register each of said first packets of charge of said first sequence and thereafter periodically and serially transferring and dividing each of said packets of charge from first charge storage cell to first charge storage cell including the transfer of portions of said packets of charge from each of said first parts to a respective collection means, a second plurality of first charge storage cells arranged in a sequence, means dividing each of said first charge storage cells except the last into parts in a manner so that the ratio of charge contained within a first part of each of said first charge storage cells to the sum of the charges contained within all of the parts thereof is equal to a respective one of a second sequential series of predetermined values, said second sequential series of predetermined values corresponding to a sequential series of weighting coefficients, each for a respective first charge storage cell, the last of said first charge storage cells of said second plurality being constituted so that the ratio of charge contained within the last of said first charge storage cells of said second plurality to the charge contained within the first of said charge storage cells of said second plurality is equal to said first predetermined fraction, said second series of weighting coefficients being identical to said first series of weighting coefficients, said second plurality of first charge storage cells being serially coupled to form a second plurality of stages of a second charge transfer shift register, each stage including a respective first charge storage cell, a second plurality of collection means, each collection meaans coupled to a first part of a respective first charge storage cell for collecting charge stored therein, the first collection means of said first plurality except the first collection means coupled to the last of said first cells being connected in common, means for providing a second input sequence of packets of charge, each packet representing a respective sample of a second signal, means for introducing sequentially into the initial cell of said second shift register each of said first packets of charge of said second sequence and thereafter periodically and serially transferring and dividing each of said packets of charge from first charge storage cell to first charge storage cell including the transfer of portions of said packets of charge from each of said first parts to a respective collection means, means for transferring the charge collected by the first collection means coupled to the last of said first cells of said first plurality to the initial one of said first cells of said second plurality, means for transferring the charge collected by the first collection means coupled to the last of said first cells of said second plurality to the initial one of said first cells of said first plurality, means for deriving signal samples each of which represents the difference of the charge collected by said first collection means of said first plurality connected in common and collected by first collection means of said second plurality connected in common.

3. The apparatus of claim 2 in which said plurality of first charge storage cells are formed in a substrate of semiconductor material.

4. The apparatus of claim 3 in which said plurality of first charge storage cells are formed adjacent a major surface of said substrate of semiconductor material.

* * * * *